(12) United States Patent
Mendelson et al.

(10) Patent No.: US 12,353,307 B2
(45) Date of Patent: Jul. 8, 2025

(54) RANDOM INSTRUCTION-SIDE STRESSING IN POST-SILICON VALIDATION

(71) Applicant: Synopsys, Inc., Sunnyvale, CA (US)

(72) Inventors: Hillel Mendelson, Melbourne (AU); Tom Kolan, Haifa (IL)

(73) Assignee: Synopsys, Inc., Sunnyvale, CA (US)

( * ) Notice: Subject to any disclaimer, the term of this patent is extended or adjusted under 35 U.S.C. 154(b) by 674 days.

(21) Appl. No.: 17/722,430

(22) Filed: Apr. 18, 2022

(65) Prior Publication Data
US 2023/0333950 A1    Oct. 19, 2023

(51) Int. Cl.
*G06F 11/27*    (2006.01)
*H01L 21/66*    (2006.01)

(52) U.S. Cl.
CPC .............. *G06F 11/27* (2013.01); *H01L 22/34* (2013.01)

(58) Field of Classification Search
CPC ........ G06F 11/27; G06F 11/263; H01L 22/34; G01R 31/318314; G01R 31/318371
See application file for complete search history.

(56) References Cited

U.S. PATENT DOCUMENTS

| 7,945,888 | B2 | 5/2011 | Adir | |
|---|---|---|---|---|
| 2009/0222694 | A1* | 9/2009 | Adir | G06F 30/33 714/26 |
| 2011/0106482 | A1* | 5/2011 | Adir | G06F 11/2236 702/119 |
| 2014/0032966 | A1* | 1/2014 | Dusanapudi | G06F 11/263 714/E11.178 |
| 2014/0032969 | A1* | 1/2014 | Landa | G06F 11/263 714/E11.178 |
| 2015/0127984 | A1 | 5/2015 | Alapati | |
| 2016/0350163 | A1* | 12/2016 | Nahir | G06F 11/079 |
| 2017/0140839 | A1* | 5/2017 | Doron | G11C 29/34 |
| 2020/0134248 | A1 | 4/2020 | Schieve | |
| 2020/0218624 | A1* | 7/2020 | Kolan | G06F 11/263 |

(Continued)

OTHER PUBLICATIONS

"Method to generate test programs with directed and finely controlled randomisation"; Online at: https://priorart.ip.com/IPCOM/000197254, Jun. 30, 2010.

(Continued)

*Primary Examiner* — Albert Decady
*Assistant Examiner* — Osman M Alshack
(74) *Attorney, Agent, or Firm* — Fenwick & West LLP

(57) ABSTRACT

A computer-implemented method including: providing a test template for a hardware system-under-test comprising one or more execution threads, wherein the test template comprises a branching instruction to a predetermined shared memory address accessible by at least some of the one or more execution threads; generating and storing, at the predetermined shared memory address, a sequence of instructions which conform to the test template; building, based, at least in part, on the test template, an executable image of a hardware exerciser, wherein the hardware exerciser is adapted to control a test cycle of the hardware system-under-test, and wherein the test cycle comprises at least generation and execution of a test; and executing the executable image of the hardware exerciser by at least a first execution thread of the one or more execution threads of the hardware system-under-test.

20 Claims, 2 Drawing Sheets

(56) References Cited

U.S. PATENT DOCUMENTS

2021/0011838 A1\* 1/2021 Kolan .................. G06F 11/263

OTHER PUBLICATIONS

A. Adir et al, "Threadmill: a post-silicon exerciser for multi-threaded processors"; DAC '11: Proceedings of the 48th Design Automation Conference; pp. 860-865, Jun. 5-10, 2011.
A.V. Smirnov et al., "Ristretto: Random Test Generator for Multicore Microprocessor Cache Coherence Verification"; Scientific Research Institute of System Analysis (SRISA RAS), Selected Articles of MES conference, issue 2, Jan. 2019.
Adir A. et al., "Concurrent Generation of Concurrent Programs for Post-Silicon Validation"; IEEE Transactions on Computer-Aided Design of Integrated Circuits and Systems, vol. 31, No. 8, pp. 1297-1302, Aug. 2012.
Joel Storm, "Random Test Generators for Microprocessor Design Validation"; 8th EMICRO Porto Alegre, RS, Brazil; Online at: https://www.oracle.com/technetwork/systems/opensparc/53-rand-test-gen-validation-1530392.pdf, May 12, 2006.
Wisam Kadry et al., "Improving Post-Silicon Validation Efficiency by Using Pre-Generated Data"; Haifa Verification Conference; Nov. 2013.

\* cited by examiner

RANDOM INSTRUCTION-SIDE STRESSING IN POST-SILICON VALIDATION

BACKGROUND

The invention relates to the field of semiconductor integrated circuit testing.

Testing a computing device or system may include executing a series of tests, each test comprising a set of computer instructions, wherein one or more of the instructions may comprise one or more parameters. Each test may also be associated with constraints, which may indicate instructions which are illegal or have illegal parameters, illegal instruction combinations, or the like.

Post-silicon validation involves operating the fabricated processor chips in actual application environments to validate correct behaviors over specified operating conditions. The validation process is commonly done using constrained test generation, wherein a test generator creates valid tests from available test templates. The generated tests are then executed on the device-under-testing for a predetermined period of time, or until a failure is detected in the test results.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

There is provided, in an embodiment, a system including at least one hardware processor; and a non-transitory computer-readable storage medium having stored thereon program instructions, the program instructions executable by the at least one hardware processor to: provide a test template for a hardware system-under-test comprising one or more execution threads, wherein the test template comprises a branching instruction to a predetermined shared memory address accessible by at least some of the one or more execution threads, generate and store, at the predetermined shared memory address, a sequence of instructions which conform to the test template, build, based, at least in part, on the test template, an executable image of a hardware exerciser, wherein the hardware exerciser is adapted to control a test cycle of the hardware system-under-test, and wherein the test cycle comprises at least generation and execution of a test, and executing the executable image of the hardware exerciser by at least a first execution thread of the one or more execution threads of the hardware system-under-test.

There is also provided, in an embodiment, a computer-implemented method including: providing a test template for a hardware system-under-test comprising one or more execution threads, wherein the test template comprises a branching instruction to a predetermined shared memory address accessible by at least some of the one or more execution threads; generating and storing, at the predetermined shared memory address, a sequence of instructions which conform to the test template; building, based, at least in part, on the test template, an executable image of a hardware exerciser, wherein the hardware exerciser is adapted to control a test cycle of the hardware system-under-test, and wherein the test cycle comprises at least generation and execution of a test; and executing the executable image of the hardware exerciser by at least a first execution thread of the one or more execution threads of the hardware system-under-test.

There is further provided, in an embodiment, a computer program product comprising a non-transitory computer-readable storage medium having program instructions embodied therewith, the program instructions executable by at least one hardware processor to: provide a test template for a hardware system-under-test comprising one or more execution threads, wherein the test template comprises a branching instruction to a predetermined shared memory address accessible by at least some of the one or more execution threads; generate and store, at the predetermined shared memory address, a sequence of instructions which conform to the test template; build, based, at least in part, on the test template, an executable image of a hardware exerciser, wherein the hardware exerciser is adapted to control a test cycle of the hardware system-under-test, and wherein the test cycle comprises at least generation and execution of a test; and executing the executable image of the hardware exerciser by at least a first execution thread of the one or more execution threads of the hardware system-under-test.

In some embodiments, the program instructions are further executable to store, and the method further comprises storing, in a non-transitory computer readable medium, before the executing, a state of the hardware system-under-test.

In some embodiments, the program instructions are further executable to restore, and the method further comprises restoring, the hardware system-under-test to the state after the executing.

In some embodiments, the building comprises embedding in the executable image data corresponding to architectural knowledge of the hardware system-under-test and testing knowledge of the hardware system-under-test.

In some embodiments, the test includes directives to control one or more parameters of a randomly generated test of the hardware system-under-test selected from the group consisting of: a desired test structure, one or more resources of the hardware system-under-test to be included in the test, one or more values to be assigned to the resources, occurrence of one or more architectural or micro-architectural events during the test, and activation of testing knowledge relating to the system-under-test.

In some embodiments, the architectural knowledge is obtained from an architectural model including a formal description of the specification for the hardware system-under-test, and wherein the testing knowledge is obtained from a testing knowledgebase including heuristics for testing desired aspects of the hardware system-under-test.

In some embodiments, the executable image comprises a code operative to provide light operating system (OS) services for the executable image.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

Figure 1:
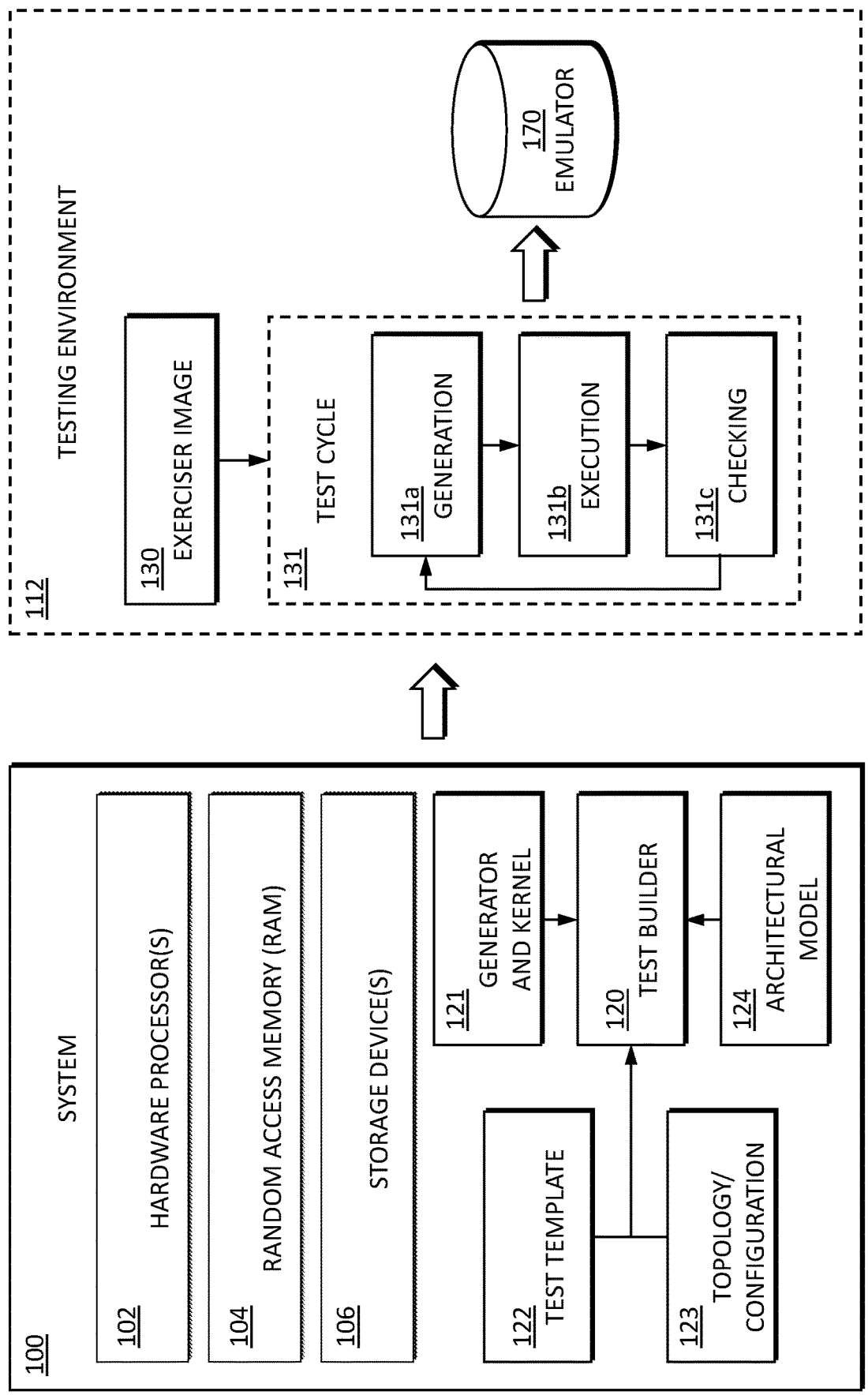
FIG. 1 is a block diagram of an exemplary system for generating random test-case code for verification of a hardware system-under-test, according to an embodiment.

Disclosed herein is a technique, embodied in a system, method, and computer program product, for generating random test-case code for verification of a hardware system-under-test, with an objective of finding and recreating functional failures ('bugs') in the tested system.

In some embodiments, the technique of the present disclosure may be particularly suited for testing multi-processor and/or multi-core and/or multi-thread systems. As used herein, the terms 'multi-processor,' 'multi-core,' and/or 'multi-thread' may refer broadly interchangeably to any computing system comprising multiple physical processing units (whether within a single integrated circuit or on multiple integrated circuits) and/or multiple virtual threads of execution, and configured to support parallel computing techniques. By extension, any reference to 'thread,' 'core,' or 'processor' may broadly interchangeably refer to any single execution thread in a multi-processor, multi-core, and/or multi-thread system.

In some embodiments, the technique of the present disclosure may be suited for 'bare-metal' testing, in the sense that it does not rely on operating system facilities, and can be loaded and run, standalone, on the testing environment (e.g., a simulator, hardware accelerator, or silicon) and 'exercise' the design by testing scenarios directly on it. In some embodiments, the technique of the present disclosure may be suited for post-silicon testing, although embodiments of the invention are not limited in this respect.

In some embodiments, the technique of the present disclosure provides for generating one or more 'shared' test codes which may be executed concurrently over any one or more threads in a multi-thread system, for efficient generating of valid, random, variable, and deterministic (i.e., having expected results) test cases for multi-thread systems, which will provide for testing and stressing targeted features that are particular to such systems.

By way of background, multi-thread systems may be affected by overburdening of memory resources (a condition known as 'thrashing'), when a computer's virtual memory resources are overused, leading to a state of constant paging and page faults, and hindering application-level processing. Thrashing can occur in the context of memory and storage, but may also affect other resources, including cache thrashing, translation lookaside buffer (TLB) thrashing, heap thrashing, process thrashing, and the like.

Multi-thread systems typically aim to alleviate these conditions by sharing as much code as possible among different threads within the same system. Thus, code sharing is an important feature of multi-thread systems, and therefore, in order to test and validate multi-thread systems having such sharing functionalities, test cases must recreate shared code for common use during the test by the different threads in the system (termed herein 'instruction-side' testing). Instruction-side testing is crucial for testing the several functionalities which are intended to optimize code sharing among multiple threads within a system, such as the instruction translation lookaside buffer (iTLB), intermediate or shared caches, and branch optimization structures.

However, current test generators are configured to create single-thread isolated tests which run concurrently on different threads, with some shared data, but generally no shared instructions. Typically, test generators permit users to define test-templates, which include various building blocks. One of these blocks is a 'SEQUENCE' statement, i.e., a construct which means that all of the statements inside the SEQUENCE statement (instructions, macros, and the like) will be generated sequentially, one after another, in a physical address that is specific to the relevant thread. The test-generation is then performed sequentially, instruction-by-instruction in program order. The two main reasons for not continuing the test generation in the subsequent physical address $PC+I_w$ (where $I_w$ is the instruction width), are branching instructions and exceptions. Other than that, the sequential ordering is maintained for each thread. In addition, branching from code generated for one thread, to code generated for another is not straightforward, because the generated code has thread-specific "context"—address translation, memory usage, specific initializations, and more. This means that generating code which can be executed concurrently or reused many times by two or more threads within a multi-thread system is challenging.

Because many micro-architectural structures are indexed by the physical and/or virtual addresses of the instruction stream rather than the data (e.g., the iTLB and other intermediate caches, I-cache, branch optimization structures, and more), this issue limits in practice the testing and stressing of the instruction-side. Accordingly, instruction-side testing has been a neglected area in hardware testing. In the absence of instruction-side testing, hardware bugs may go undetected, which may lead to severe ramifications—for example, executing the wrong instructions in runtime, which may lead to security breaches and similar failures.

Accordingly, in some embodiments, the present technique provides for generating valid, random, variable, and deterministic shared test code for multi-thread systems, which may be executed concurrently and/or repeatedly over any thread within the system, thus causing instruction-side sharing and stressing, and more closely replicating real-life scenarios where shared code is executed by more than one thread. the present techniques may provide for generating shared test codes which cover many window-condition cases due to instruction sharing in the cache system, and replicate real-life scenarios as well as boundary conditions, with deterministic and testable results.

In some embodiments, the present technique provides for decoupling shared code generation from the test execution order, and allows sharing of randomly generated code among multiple threads. In some embodiments, the present technique provides for thread-agnostic or oblivious 'remote' generation of shared code, which may then be accessed or branched-into by any thread in the system, at any physical address location, without any constraint as to when or where it may be executed.

In some embodiments, the present technique provides for generating a shared standalone/remote 'SEQUENCE' statement having a physical address attribute given by a specified variable, wherein the shared SEQUENCE can be executed on all threads/cores in the system, and wherein the physical address is the starting physical address in which the SEQUENCE statement will be generated when generating the test code by a thread of the multi-thread system-under-testing. When encountering this shared SEQUENCE statement, a test generator of the present disclosure will update its pointers and continue the generation in the specified physical address. When execution of the SEQUENCE statement is completed, the generation will resume to the previous pointer, in the same state, as if the shared code section was generated independently of the test-case.

In some embodiments, this permits a user to incorporate parallel/concurrent code sharing among different threads/cores within a multi-thread system, wherein each thread/core may independently branch to and access the shared remote code at any given point in the execution. In some embodiments, each thread on the multi-thread system can branch to and access the shared code as many times as is needed or desirable for testing purposes, essentially treating it as a function which may be called at any given point in the execution of the test case. In some embodiments, such accessing thread may further add additional stressing by incorporating TLB-invalidates, cache-invalidates, or plain-loads from the shared code area.

In some embodiments, in addition to improving instruction-side stressing of the system-under-testing, the present technique also improves utilization and reduces computational overhead by reusing generated code. Moreover, the shared code has a smaller footprint, and may be only generated once every several test-cases and reused in between.

In some embodiments, the present technique enables code sharing among different threads by protecting thread-specific behavior in various ways, as follows:

Thread-agnostic shared code generation: The present technique provides for shared code which may be executed from any thread within a multi-thread system. To enable this, the present technique avoids generating any random thread-specific instructions in the shared code, and by default generates a branch-back instruction at the end of the shared code. Thus, the shared code may be treated as a function which may be recalled from any point, and stores the registers being used within the shared code, where the thread-specific inputs (e.g. memory addresses) are located by the template writer in predefined registers prior to branching to the remote code.

Storing of test generator state: The present technique provides for storing of the test generator state before generating a remote code SEQUENCE. The stored test generator state may be restored once remote generation is completed. Specifically, in some embodiments, the present technique provides for storing a pointer and restoring to a subsequent pointer upon completion of the remote code generation. In addition, the present technique provides for storing the address translation context and the machine state (in case they may change in the remote code), and restore to them when done.

Automatic allocation of shared code area: The present technique provides for automatic allocation of random memory locations, such that each area has a defined size. The test generator is aware of this size, so it can control the length of the generated code, to ensure that it is not being overflowed.

Alternative uses of shared code: A user may employ the shared code technique of the present disclosure in several ways. For example, a user may configure the test generator to generate random functions which may then be called by individual threads within the system in multiple points during execution.

Thread-specific false shared code generation: A user may also generate random short sequences (e.g., comprising few instructions) which use the same cache line by several threads in parallel. This does not create shared code, so the instructions have much less constraints, however, this does stress the I-cache by creating false sharing between instructions that are executed concurrently. A user may further use the shared code to generate branches to arbitrary addresses in memory (backwards and forward), with any branch offset (when possible). This covers a much wider range of the processor's branching capabilities than when limited to the test-case memory area itself.

Reference is now made to FIG. 1 which shows a block diagram of an exemplary system 100 for generating random test-case code for verification of a hardware system-under-test, according to an embodiment. A non-limiting list of hardware devices-under-test includes, for example, a hardware processor, a multiprocessor, a controller, a CPU, a DSP, a bus-bridge, a circuit, an integrated circuit, a direct memory access (DMA) controller, or the like.

System 100 may include one or more hardware processor(s) 102, a random-access memory (RAM) 104, and one or more non-transitory computer-readable storage device(s) 106. Storage device(s) 106 may have stored thereon program instructions and/or components configured to operate hardware processor(s) 102. The program instructions may include one or more software modules, such as test builder 120, generator and kernel module 121, test template 122, system topology and configuration module 123, and architectural model 124.

The software components may include an operating system having various software components and/or drivers for controlling and managing general system tasks (e.g., memory management, storage device control, power management, etc.), and facilitating communication between various hardware and software components. System 100 may operate by loading instructions of its various software modules into RAM 104 as they are being executed by processor(s) 102. System 100 may optionally be implemented or may operate, for example, using a computing system such as, for example, a computer, a personal computer (PC), a server computer, a computing device, a computing platform, a client/server system, a mobile computer, a portable computer, a laptop computer, a notebook computer, a tablet computer, or the like. System 100 may also include, for example, a system bus, an input unit, an output unit, a communication unit, and other suitable hardware components and/or software components.

System 100 as described herein is only an exemplary embodiment of the present invention, and in practice may be implemented in hardware only, software only, or a combination of both hardware and software. System 100 may have more or fewer components and modules than shown, may combine two or more of the components, or may have a different configuration or arrangement of the components. System 100 may include any additional component enabling it to function as an operable computer system, such as a motherboard, data busses, power supply, a network interface card, a display, an input device (e.g., keyboard, pointing device, touch-sensitive display), etc. (not shown). Moreover, components of system 100 may be co-located or distributed, or the system may be configured to run as one or more cloud computing "instances," "containers," "virtual machines," or other types of encapsulated software applications, as known in the art.

In some embodiments, system 100 receives various user directives and inputs, generates a corresponding exerciser image 130 of an exerciser in testing environment 112, which can then be loaded and run on an emulator 170 and monitored for potential failures.

To perform the build process and produce exerciser image 130, test builder 120 may rely on input from one or more of the modules of system 100, such as test template 122, system topology and configuration module 123, and architectural model 124. Test builder 120 may also compile data and/or code from generator and kernel module 121 into the exerciser image.

In some embodiments, generator and kernel module 121 may include code to allow exerciser image 130 to perform a test cycle 131 comprising generation 131a, execution 131b, and checking 131c. Generator and kernel module 121 may further include code to provide light operating system (OS) services for the exerciser image, such as loading the image, context switching, various system queries, and the like. In some embodiments, the system and method described herein is adapted to check the design of the system-under-test in a pure "bare metal" form by running a test cycle 131 directly on the tested system, including both the generation and the testing. As used herein, the term "bare metal" refers to execution having direct unrestricted machine access without an intervening operating system.

Test template 122 allows a user to specify a desired test structure. The test template is defined in a context-free formal language and includes biasing directives to influence at least one of: a desired test structure, one or more resources to be included in the test, and one or more values of the included resources. For example, test template 122 may specify a load instruction, and exerciser 130, when generating a test according to the template, may randomly select a specific load form, registers, memory address, and data to be used by the load instruction. The biasing directives may also influence the occurrence of specific architectural or micro-architectural events during test execution 131b. Further, many of these random decisions may be biased towards values that are more interesting for verification purposes. In some embodiments, the biasing directives may also influence activation of the testing knowledge included in architectural model 124.

In some embodiments, the test-template language may express a potentially infinite variety of test-sets, for example, by following a context-free grammar that supports a description of a stream of instructions or a general scenario. Test template 122 may describe a set of tests for the biased random generation, and may assign some of the tests from the set a higher probability of being generated than other tests. For example, test template 122 may include an instruction stream description together with biasing and instruction-level templates and, optionally, a specification of a validation routine to be used.

For example, the instruction stream may include a description of the number of instructions or cycles, of instruction groups, of participating instructions, of repeated template-blocks, of alternative template blocks for selection, of relative weights for the selection alternatives, of loops, branches, and/or macros, and the like. In some embodiments, the instruction stream description may be provided as a per-thread specification. The biasing and instruction-level templates may include a description of, for example, an instruction-field specification and constraints over the instruction fields, desired architectural or micro-architectural events such as exceptions or interrupts, limiting of undesired interrupts or other events, resource interdependency including specific registers, addresses, and/or cache lines to be accessed or avoided, locality of accesses depending on configuration, control of floating-point register data, and the like. The optional validation method specification may include, for example, a validation routine that checks a predictable aspect that is specific to the test-programs generated from the template. In accordance with embodiments of the invention, the test template may express the above information in a relatively compact manner.

Optionally, system topology and configuration module 123 may provide information to test builder 120 regarding the system structure to be tested. For example, this may include information regarding the number of nodes, cores, processors, and/or active threads, processor clustering information, available memory per cluster, and the like.

Architectural model 124 may include a formal description of the verified architecture for which the exerciser is needed, as well as heuristics for testing desired aspects of the system-under-test, e.g., in the form of a formal declarative description, or code and template libraries that can be incorporated into the generated tests. The model is available to users for both reading and updating and enables the user to create an instance of the tool, e.g., using test builder 120, that is appropriate to the tested architecture. Accordingly, exerciser 130 may be a model-based exerciser built in an architecture-independent manner and that receives relevant information about the architecture from an external model, e.g., from architectural model 124. The model includes a declarative description of the architecture, as well as architecture-specific expert testing knowledge.

In some embodiments, architectural model 124 may hold details that are required for generating valid, high-quality test-programs. Architectural model 124 may include system hierarchy rules, instruction-types, resource-initialization rules, and any architecture- or implementation-dependent testing-knowledge and biasing option provided to the user. For example, such a model may be created per implementation of a processor-based hardware system.

In some embodiments, model 124 may include a description of the design to be tested, its expected behavior, and expert testing knowledge regarding the design. For example, testing-knowledge heuristics may be modeled through data-classification or data-types, constraints and generation-functions that influence generation decisions (which may be controlled by the user through test-template 122), and fine-tuning of the generation scheme through biasing weights and default values.

In accordance with embodiments of the invention, builder module 120 compiles inputs from modules 121, 122, 123, and 124 to produce an executable image 130 of the desired exerciser. Exerciser image 130 incorporates a compact representation of the main inputs described above. For example, exerciser image 130 may include embedded data representing architectural knowledge and testing knowledge of the system-under-test, embedded data representing the topology and configuration setup for the system-under-test, and embedded data representing the test template 122. Test builder 120 may optimize a size of hardware exerciser image 130 by selecting only a relevant portion of architectural model 124 to include in the embedded data.

In testing environment 112, exerciser image 130 may be loaded onto a test platform 170 comprising, for example, an accelerator, a hardware prototype, or a wafer. Exerciser image 130, supported by minimal OS services, may then control a test cycle 131 including generation 131a, execution 131b, and checking 131c of random-biased generated tests.

Generation 131a may follow a scheme provided by the test template data to generate any number of random tests that satisfy the template. Any aspect of the test that is not decided by the test-template (e.g., left unspecified or just partially constrained) may be randomly decided by the generation scheme. The random decisions should satisfy the test-template constraints specified in template data and the architectural constraints specified in the architectural model and topology data. For example, the uniformity of the random decisions may be biased either by user directives included in the test template or by default testing knowledge.

Checking 131c may follow any suitable validation routine or method. A non-limiting list of checking methods for use in accordance with embodiments of the invention includes hardware-implemented traps, a dual-pass approach, comparing test results to a reference model, checking for specific predictable results, and the like. For example, in some embodiments, the embedded data representing the test template 122 may include the results to be verified. A dual pass checking method may include executing each generated test twice, recording the results of the executions, and comparing for consistency. In one example, the two executions 131c may be set to differ only in their respective micro-architecture scheduling. In some embodiments, a multiple test pass variation may be used. The passes may be scheduled with random delays or in a synchronized lock-step mode. In one example, a reference pass may be executed in trace mode to provide additional accuracy. Additionally or alternatively, an external monitoring mechanism may be implemented.

Figure 2:
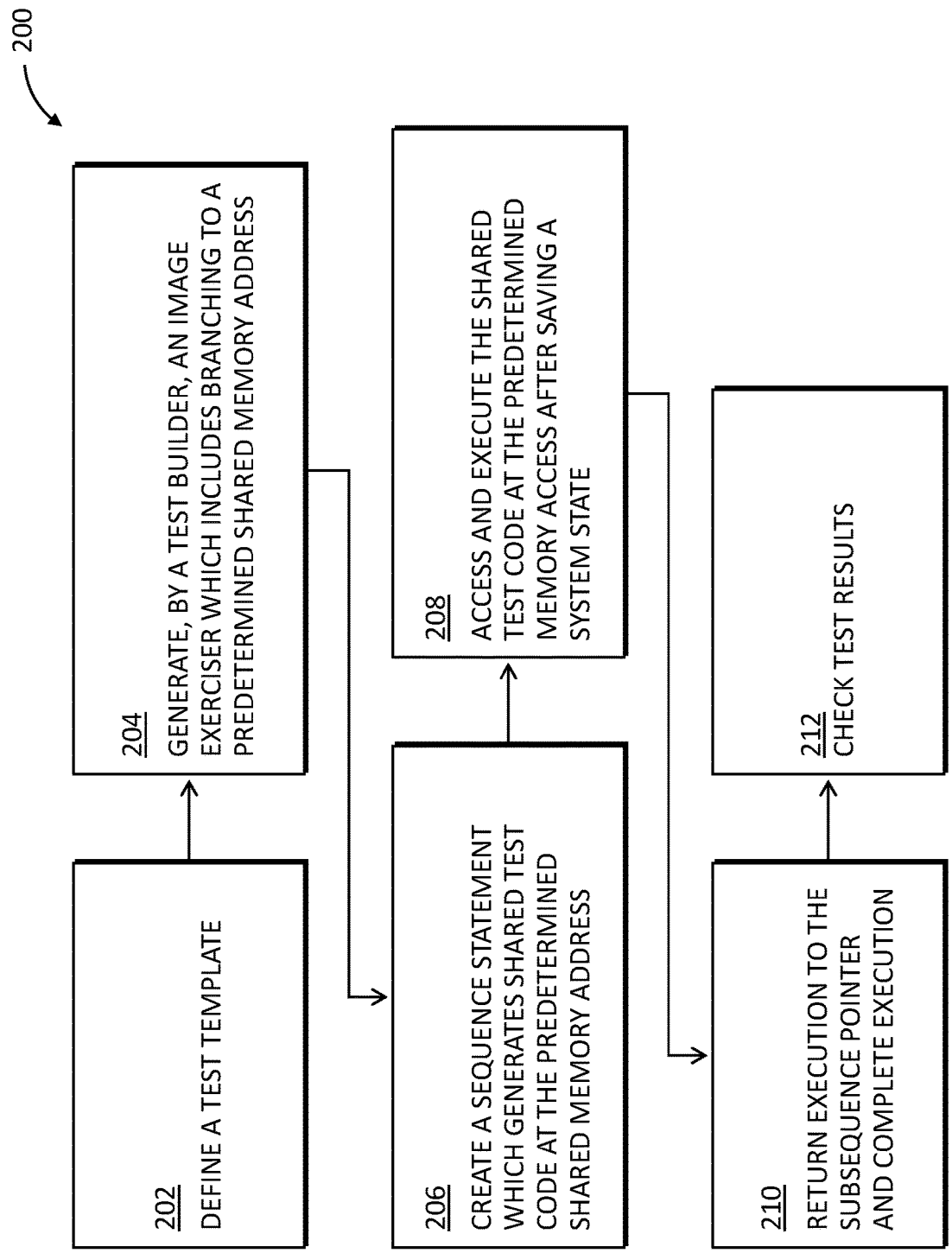
FIG. 2 is a flowchart illustrating a method for generating random test-case code for verification of a hardware system-under-test, according to an embodiment.

The instructions of system 100 are now discussed with reference to the flowchart of FIG. 2, which illustrates a method 200 for generating random test-case code for verification of a hardware system-under-test, according to an embodiment.

Steps of method 200 may either be performed in the order they are presented or in a different order (or even in parallel), as long as the order allows for a necessary input to a certain step to be obtained from an output of an earlier step. In addition, the steps of method 200 are performed automatically (e.g., by system 100 of FIG. 1 and its various components and software modules), unless specifically stated otherwise. Accordingly, numerical references refer to the various components and software modules of system 100 as presented in FIG. 1.

In step 202, a test template 122 may be defined for directing a randomly-generated test of the hardware multi-thread or multi-core system-under-test. In some embodiments, the test template may include biasing directives to influence, for example, a desired test structure, one or more resources of the system-under-test to be included in the test, and/or one or more values of the included resources. In some embodiments, an underlying model 124 used by system 100 may include architectural knowledge and testing knowledge, obtained from a testing knowledge base including heuristics for testing desired aspects of the system-under-test. In some embodiments, building the exerciser image 130 may be independent of and without any specific system-architecture, testing-knowledge, configuration and/or topology. For example, test builder 120 may combine generic, system-oblivious code, e.g., provided by generator and kernel module 121, with system-specific knowledge extracted from an external model and/or knowledgebase, e.g., architectural model and testing knowledgebase 124.

In step 204, test builder 120 may build exerciser image 130, adapted to control and to implement at least one test cycle of the system-under-test. In some embodiments, executing the exerciser image 130 within testing environment 112 includes generating one or more valid tests 131a for the system-under-test that satisfy the given test template 122, executing the tests 131b, and checking the results 131c. The exerciser image 130 is able to generate valid, high-quality tests for any system-under-test by using the system-specific knowledge provided by the underlying model, and to control the test cycle according to the biasing directives provided by the test template.

In step 206, system 100 may cause the creation of a SEQUENCE statement (comprising one or more instructions, macros, and the like) which pushes out at least some test code creation into a shared area of the memory, wherein the shared code may subsequently be accessed during any test cycle 131 performed over any thread/core of the system-under-testing, for purposes of inclusion in a corresponding test run over the accessing thread.

In some embodiments, creation of the SEQUENCE statement may be included in the image exerciser 130, wherein the image exerciser 130 forces the creation of a series of instructions included in the 'SEQUENCE' statement at a predetermined shared memory location, which may be subsequently accessed and executed by all threads/cores in the system-under-testing. In other embodiments, the SEQUENCE statement may be generated independently of image exerciser 130.

In some embodiments, an exemplary SEQUENCE statement which may be generated in accordance with the present disclosure may be represented as:

```
<SEQUENCE address="$FunctionCodeArea">
    //Shared code
</SEQUENCE>
```

In another example, a shared SEQUENCE statement may be configured to generate three random load-double (ld) instructions, which may be executable over any one or more threads/cores in the system-under-testing, within a physical address given by the variable $NestedArea:

```
<SEQUENCE address="$LoadsArea">
    <REPEAT times="3">
        <I name="ld"/>
    </REPEAT>
</SEQUENCE>
```

In step 208, system 100 may cause execution step 131b in test cycle 131 to execute over a first thread of the system-under-testing, wherein execution step 131b comprises accessing and executing the SEQUENCE statement created in step 206 above at the predetermined memory address.

In some embodiments, system 100 may be configured to store the state of the test generator before accessing and executing the shared memory location during generation step 131a of test cycle 131. In some embodiments, the stored state may be restored once generation step 131a is completed. Specifically, in some embodiments, the present technique provides for storing a pointer and restoring to a subsequent pointer upon completion of the generation step 131a. In addition, the present technique provides for storing the address translation context and the machine state (in case they may change in the remote code), and restore to them when done. Generally, the present technique provides for saving and restoring the entire generator state, in addition to the pointer.

Execution step 131b then continues for a predetermined period of time, or until a failure is detected in the test results.

In step 212, checking step 131c may follow any suitable validation routine or method of test results, such as by comparing test results to a reference model, checking for specific predictable results, and the like. For example, in some embodiments test template 122 may include the results to be verified.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. Rather, the computer readable storage medium is a non-transient (i.e., not-volatile) medium.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, a field-programmable gate array (FPGA), or a programmable logic array (PLA) may execute the computer readable program instructions by utilizing state information of the computer readable program instructions to personalize the electronic circuitry, in order to perform aspects of the present invention. In some embodiments, electronic circuitry including, for example, an application-specific integrated circuit (ASIC), may be incorporate the computer readable program instructions already at time of fabrication, such that the ASIC is configured to execute these instructions without programming.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In the description and claims, each of the terms "substantially," "essentially," and forms thereof, when describing a numerical value, means up to a 20% deviation (namely, ±20%) from that value. Similarly, when such a term describes a numerical range, it means up to a 20% broader range—10% over that explicit range and 10% below it).

In the description, any given numerical range should be considered to have specifically disclosed all the possible subranges as well as individual numerical values within that range, such that each such subrange and individual numerical value constitutes an embodiment of the invention. This applies regardless of the breadth of the range. For example, description of a range of integers from 1 to 6 should be considered to have specifically disclosed subranges such as from 1 to 3, from 1 to 4, from 1 to 5, from 2 to 4, from 2 to 6, from 3 to 6, etc., as well as individual numbers within that range, for example, 1, 4, and 6. Similarly, description of a range of fractions, for example from 0.6 to 1.1, should be considered to have specifically disclosed subranges such as from 0.6 to 0.9, from 0.7 to 1.1, from 0.9 to 1, from 0.8 to 0.9, from 0.6 to 1.1, from 1 to 1.1 etc., as well as individual numbers within that range, for example 0.7, 1, and 1.1.

The descriptions of the various embodiments of the present invention have been presented for purposes of illustration, but are not intended to be exhaustive or limited to the explicit descriptions. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the description and claims of the application, each of the words "comprise," "include," and "have," as well as forms thereof, are not necessarily limited to members in a list with which the words may be associated.

Where there are inconsistencies between the description and any document incorporated by reference or otherwise relied upon, it is intended that the present description controls.

What is claimed is:

1. A system comprising:
   at least one hardware processor; and
   a non-transitory computer-readable storage medium having stored thereon program instructions, the program instructions executable by the at least one hardware processor to:
   provide a test template for a multi-threaded hardware system-under-test comprising two execution threads, wherein the test template comprises a branching instruction to a predetermined shared memory address accessible by the two execution threads,
   generate and store, at said predetermined shared memory address, shared code comprising a sequence of instructions which conform to said test template,
   build, based, at least in part, on said test template, an executable image of a hardware exerciser, wherein the hardware exerciser is adapted to control a test cycle of the hardware system-under-test, and wherein the test cycle comprises generating and executing a test of common use of the shared code by the two execution threads, and
   executing said executable image of the hardware exerciser, including the common use of the shared code by the two execution threads.

2. The system of claim 1, wherein the program instructions are further executable to store, in said non-transitory computer readable medium or in a different non-transitory computer readable medium, before said executing, a state of said hardware system-under-test.

3. The system of claim 2, wherein the program instructions are further executable to restore said hardware system-under-test to said state after said executing.

4. The system of claim 1, wherein said building comprises embedding in said executable image data corresponding to architectural knowledge of said hardware system-under-test and testing knowledge of said hardware system-under-test.

5. The system of claim 1, wherein said test includes directives to control one or more parameters of a randomly generated test of said hardware system-under-test selected from the group consisting of: a desired test structure, one or more resources of the hardware system-under-test to be included in said test, one or more values to be assigned to said resources, occurrence of one or more architectural or micro-architectural events during said test, and activation of testing knowledge relating to the system-under-test.

6. The system of claim 5, wherein said architectural knowledge is obtained from an architectural model including a formal description of the specification for said hardware system-under-test, and wherein said testing knowledge is obtained from a testing knowledgebase including heuristics for testing desired aspects of said hardware system-under-test.

7. The system of claim 1, wherein the executable image comprises a code operative to provide light operating system (OS) services for the executable image.

8. A computer-implemented method comprising:
   providing a test template for a multi-threaded hardware system-under-test comprising two execution threads, wherein the test template comprises a branching instruction to a predetermined shared memory address accessible by the two execution threads;
   generating and storing, at said predetermined shared memory address, shared code comprising a sequence of instructions which conform to said test template;
   building, based, at least in part, on said test template, an executable image of a hardware exerciser, wherein the hardware exerciser is adapted to control a test cycle of the hardware system-under-test, and wherein the test cycle comprises generating and executing a test of common use of the shared code by the two execution threads; and
   executing said executable image of the hardware exerciser, including the common use of the shared code by the two execution threads.

9. The computer-implemented method of claim 8, further comprising storing, in a non-transitory computer readable medium, before said executing, a state of said hardware system-under-test.

10. The computer-implemented method of claim 9, further comprising restoring said hardware system-under-test to said state after said executing.

11. The computer-implemented method of claim 8, wherein said building comprises embedding in said executable image data corresponding to architectural knowledge of said hardware system-under-test and testing knowledge of said hardware system-under-test.

12. The computer-implemented method of claim 8, wherein said test includes directives to control one or more parameters of a randomly generated test of said hardware system-under-test selected from the group consisting of: a desired test structure, one or more resources of the hardware system-under-test to be included in said test, one or more values to be assigned to said resources, occurrence of one or more architectural or micro-architectural events during said test, and activation of testing knowledge relating to the system-under-test.

13. The computer-implemented method of claim 12, wherein said architectural knowledge is obtained from an architectural model including a formal description of the specification for said hardware system-under-test, and wherein said testing knowledge is obtained from a testing knowledgebase including heuristics for testing desired aspects of said hardware system-under-test.

14. The computer-implemented method of claim 8, wherein the executable image comprises a code operative to provide light operating system (OS) services for the executable image.

15. The computer-implemented method of claim 8, executed by a processor of a computing device.

16. A computer program product comprising a non-transitory computer-readable storage medium having program instructions embodied therewith, the program instructions executable by at least one hardware processor to:
provide a test template for a multi-threaded hardware system-under-test comprising two execution threads, wherein the test template comprises a branching instruction to a predetermined shared memory address accessible by the two execution threads;
generate and store, at said predetermined shared memory address, shared code comprising a sequence of instructions which conform to said test template;
build, based, at least in part, on said test template, an executable image of a hardware exerciser, wherein the hardware exerciser is adapted to control a test cycle of the hardware system-under-test, and wherein the test cycle comprises generating and executing a test of common use of the shared code by the two execution threads; and
executing said executable image of the hardware exerciser, including the common use of the shared code by the two execution threads .

17. The computer program product of claim 16, wherein the program instructions are further executable to store, in said non-transitory computer readable medium or in a different non-transitory computer readable medium, before said executing, a state of said hardware system-under-test.

18. The computer program product of claim 17, wherein the program instructions are further executable to restore said hardware system-under-test to said state after said executing.

19. The computer program product of claim 16, wherein said building comprises embedding in said executable image data corresponding to architectural knowledge of said hardware system-under-test and testing knowledge of said hardware system-under-test.

20. The computer program product of claim 16, wherein said test includes directives to control one or more parameters of a randomly generated test of said hardware system-under-test selected from the group consisting of: a desired test structure, one or more resources of the hardware system-under-test to be included in said test, one or more values to be assigned to said resources, occurrence of one or more architectural or micro-architectural events during said test, and activation of testing knowledge relating to the system-under-test.

* * * * *